US007582394B2

(12) United States Patent
Noda et al.

(10) Patent No.: US 7,582,394 B2
(45) Date of Patent: Sep. 1, 2009

(54) PHOTOMASK AND METHOD FOR FORMING PATTERN

(75) Inventors: Kenji Noda, Osaka (JP); Shin Hashimoto, Osaka (JP)

(73) Assignee: Panasonic Corporation, Osaka (JP)

( * ) Notice: Subject to any disclaimer, the term of this patent is extended or adjusted under 35 U.S.C. 154(b) by 710 days.

(21) Appl. No.: 10/957,599

(22) Filed: Oct. 5, 2004

(65) Prior Publication Data

US 2005/0074682 A1 Apr. 7, 2005

(30) Foreign Application Priority Data

Oct. 6, 2003 (JP) .............................. 2003-346832

(51) Int. Cl.
*G03F 1/00* (2006.01)
*H01L 21/00* (2006.01)

(52) U.S. Cl. ............................ 430/5; 430/311; 430/312

(58) Field of Classification Search ..................... 430/5, 430/296, 311, 312
See application file for complete search history.

(56) References Cited

U.S. PATENT DOCUMENTS 5,725,973 A * 3/1998 Han et al. ...................... 430/5
6,090,527 A * 7/2000 Yamazaki et al. ........... 430/296
2002/0045134 A1* 4/2002 Inoue et al. ................. 430/311
2004/0145027 A1* 7/2004 Nitta et al. .................. 257/492

FOREIGN PATENT DOCUMENTS

JP 2000-98587 A 4/2000
JP 2002-116459 4/2002

OTHER PUBLICATIONS

English translation of JP 2000-98587 A published on Apr. 7, 2000.*
Japanese Office Action with English translation issued in Japanese Patent Application Patent No. 2004-286535, mailed May 15, 2007.

* cited by examiner

*Primary Examiner*—Mark F Huff
*Assistant Examiner*—Jonathan Jelsma
(74) *Attorney, Agent, or Firm*—McDermott Will & Emery LLP

(57) ABSTRACT

A photomask includes, on a translucent substrate, three or more first light-shielding portions each in insular shape having a property of shielding exposure light and spaced equidistantly, a second light-shielding portion having a property of shielding the exposure light and formed to connect the adjacent first light-shielding portions, and first light-transmitting portions each in slit shape having a property of transmitting the exposure light and formed to be surrounded with the first and second light-shielding portions. The second light-shielding portion is formed to contain a point located equidistantly from the three or more first light-shielding portions.

11 Claims, 8 Drawing Sheets

100A
100B
110c
110a
120a
120
120b

PHOTOMASK AND METHOD FOR FORMING PATTERN

CROSS-REFERENCE TO RELATED APPLICATIONS

This application claims priority under 35 U.S.C. § 119 on Patent Application No. 2003-346832 filed in Japan on Oct. 6, 2003, the entire contents of which are hereby incorporated by reference.

BACKGROUND OF THE INVENTION (a) Fields of the Invention

The present invention relates to photomasks and methods for forming a pattern using the photomask. In particular, the present invention relates to methods for forming, in the same step, a via feature and a plurality of slit features intersecting or joining each other.

(b) Description of Related Art

Line features or slit features formed on a semiconductor substrate are required to be formed faithfully based on design patterns of a semiconductor circuit. Thus, if a resist pattern having a bent shape that is difficult to form faithfully based on a design pattern is formed on a semiconductor substrate, a photomask is used which is provided with assist light-shielding portions or assist light-transmitting portions.

As an example of such a technique, a proposal is made if a conventional pattern formation method disclosed in Japanese Unexamined Patent Publication No. 2002-116459. Hereinafter, the conventional pattern formation method using a photomask provided with assist light-shielding portions or assist light-transmitting portions will be described with reference to FIGS. 7A, 7B, 8A, 8B, 9A, and 9B.

FIGS. 7A and 7B are plan views showing exemplary design patterns. FIGS. 8A and 8B are plan views showing conventional photoresist patterns. FIGS. 9A and 9B are plan views showing conventional reticle patterns with assist features.

Referring to FIGS. 7A and 7B, when a semiconductor device or the like is designed, a line feature 1*a* as shown in FIG. 7A or a slit feature 2*a* as shown in FIG. 7B is employed in the design stage for the purpose of configuring circuitry in the device. If the line feature 1*a* shown in FIG. 7A is formed, a mask for exposure is employed in which a region occupied by the line feature 1*a* is used as a light-shielding portion during exposure and in which a region 1*b* surrounding the line feature 1*a* is used as a light-transmitting portion during exposure. If the slit feature 2*a* shown in FIG. 7B is formed, a mask for exposure is employed in which a region occupied by the slit feature 2*a* is used as a light-transmitting portion during exposure and in which a region 2*b* surrounding the line feature 2*a* is used as a light-shielding portion during exposure.

One means for forming a line feature or a slit feature on a semiconductor substrate based on the design pattern shown in FIG. 7A or 7B is means by which a photoresist film is patterned.

As an example, the following discusses the case where a positive photoresist film is patterned. If use is made of a photomask on which the above line feature 1*a* shown in FIG. 7A is transferred, the line feature 5*a* as shown in FIG. 8A is formed in the film. If use is made of a photomask on which the above slit feature 2*a* shown in FIG. 7B is transferred, the slit feature 6*a* shown in FIG. 8B is formed in the film.

To be more specific, as shown in FIG. 8A, the line feature 5*a* is formed of a remaining portion of the photoresist film and surrounded with the region 5*b* where the photoresist film has been removed. A dotted line 5*c* indicates the contour of the line feature 1*a* shown in FIG. 7A. As is obvious from the comparison between the line feature 5*a* and the dotted line 5*c*, an area located within the region surrounded with the dotted line 5*c* and not formed with the photoresist film or an area located without that region and formed with the photoresist film exists in the vicinity of each bent portion of the line feature 5*a*.

On the other hands, as shown in FIG. 8B, the slit feature 6*a* is formed of a region in which the photoresist film has been removed and which is surrounded with a remaining portion 6*b* of the photoresist film. A dotted line 6*c* indicates the contour of the slit feature 2*a* shown in FIG. 7B. Like the previous case, as is obvious from the comparison between the slit feature 2*a* and the dotted line 6*c*, an area located within the region surrounded with the dotted line 6*c* and formed with the photoresist film or an area located without that region and not formed with a photoresist film exists in the vicinity of each bent portion of the slit feature 6*a*.

Ideally, the line and slit features 5*a* and 6*a* shown in FIGS. 8A and 8B should be formed in the same shapes as the line feature 1*a* (see FIG. 7A) and the slit feature 2*a* (see FIG. 7B) indicated by the dotted lines 5*c* and 6*c*, respectively. However, actually, as shown above, the bent portions of the line feature 5*a* and the slit feature 6*a* are not formed in the same shapes as those of the line feature 1*a* (see FIG. 7A) and the slit feature 2*a* (see FIG. 7B).

As mentioned above, the problem that the design pattern and the photoresist pattern formed based on the designed pattern differs in shape becomes more severe as the pattern is finer.

To overcome this problem, in the conventional pattern formation method, photomasks as shown in FIGS. 9A and 9B having patterns with assist features 7*c*, 7*d*, 8*c*, and 8*d* additionally attached to the comers thereof are employed in order for the photoresist pattern formed based on the designed pattern to have the same shape as the design pattern.

To be more specific, in the case of a reticle pattern shown in FIG. 9A, the corners of a light-shielding portion 7*a* formed in a light-transmitting portion 7*b* for transmitting light during exposure are provided with assist features 7*c* serving as light-shielding portions during exposure and an assist feature 7*d* serving as a light-transmitting portion during exposure. Likewise, in the case of a reticle pattern shown in FIG. 9B, the corners of a light-transmitting portion 8*a* formed in a light-shielding portion 8*b* for shielding light during exposure are provided with assist features 8*c* serving as light-transmitting portions during exposure and an assist feature 8*d* serving as a light-shielding portion during exposure. When the corners of the pattern are provided with the assist features 7*c*, 7*d*, 8*c* and 8*d*, this reduces the phenomenon that light diffracts around or does not come into the corners of the pattern during exposure. Therefore, a photoresist pattern having almost the same shape as the design pattern can be formed.

However, if, in the step of forming via features, via features as shown in FIG. 10A as well as a plurality of slit features as shown in FIG. 10B intersecting or joining one another and having widths within a predetermined size are simultaneously formed, the light intensity required for the formation of these features inevitably becomes extremely high throughout the entire photoresist film for successful formation of the via features. Therefore, if pattern formation is carried out in the same step using a photomask as shown in FIG. 10A employed for forming via features and composed of light-transmitting portions 12*a* and a light-shielding portion 12*b* and a photomask as shown in FIG. 10B employed for forming a plurality of slit features intersecting or joining one another and composed of a light-transmitting portion 12c and a light-shielding portion 12d, slit features 13c formed in a photoresist 13d shown in FIG. 11B have greater widths than via features 13a formed in a photoresist 13b shown in FIG. 11A even though the length of each side of the light-transmitting portion 12a shown in FIG. 10A is equal to the width of the light-transmitting portion 12c shown in FIG. 10B. Moreover, the reason why the regions of the slit features 13c in FIG. 11B located around the intersecting or joining point are larger than the regions of the light-transmitting portion 12c in FIG. 10B located around the intersecting or joining point is that light diffraction strengthens around the intersecting or joining point of the slit features 13c. As is apparent from the above, it is extremely difficult to form, in the same step, the via features and the plurality of slit features intersecting or joining one another and having widths within a predetermined size.

SUMMARY OF THE INVENTION

With the foregoing in mind, an object of the present invention is to provide a photomask and a pattern formation method capable of forming a plurality of slit features intersecting or joining one another with good reproducibility. Another object of the present invention is to provide a photomask and a pattern formation method capable of forming via features and the slit features in the same step.

To attain the above objects, a first method for forming a pattern according to the present invention is characterized by comprising the steps of: radiating exposure light to a resist film through a photomask; and developing the resist film radiated with the exposure light to form a resist pattern having a plurality of slit features formed to intersect or join each other. The first method is further characterized in that the step of radiating exposure light is the step of radiating exposure light through the photomask including, on a translucent substrate, first light-transmitting portions having a property of transmitting the exposure light and having the same shapes as the plurality of slit features in terms of plan arrangement, first light-shielding portions having a property of shielding the exposure light and each formed to be surrounded with the first light-transmitting portions, and a second light-shielding portion formed in the first light-transmitting portions to contain a point at which the first light-transmitting portions intersect or join each other.

In the first pattern formation method of the present invention, the photomask is prepared in which the second light-shielding portion is formed in the region of the first light-transmitting portion containing the point at which the first light-transmitting portions intersect or join each other, and exposure is performed using this photomask. Therefore, the light intensity of the exposure light can be reduced in the vicinity of the intersecting or joining point, and thus a resist pattern can be formed which has a plurality of slit features faithfully reproduced to intersect or join one another. Specifically, for example, if a photomask provided with no second light-shielding portion is used, this increases the light intensity of the exposure light which is radiated in the vicinity of the region on the resist film corresponding to the point located equidistantly from the first light-shielding portions. As a result, slit features having corners in, for example, rounded shapes are formed. In contrast to this, with the present invention, use is made of the photomask having the second light-shielding portion provided in the region on the photomask corresponding to the region of the resist film radiated with exposure light of a high intensity, that is, in the region thereof containing the point at which the first light-transmitting portions intersect or join each other. Therefore, as described above, a resist pattern having slit features reproduced faithfully can be formed. Note that the second light-shielding portion in this case preferably has a width that is not recognized as a mask pattern failure in a mask pattern check.

Preferably, in the first method for forming a pattern according to the present invention, the photomask is formed with a first region having a first open area ratio and a second region having a second open area ratio higher than the first open area ratio, and the step of radiating exposure light includes the step of simultaneously radiating the exposure light to the first region and the second region.

With this method, even if the regions of the photomask with different open area ratios are simultaneously exposed to light, the resist pattern with the slit features and the resist pattern with an open area ratio different from that of the resist pattern with the slit features can be faithfully formed in the same step.

Preferably, in the first method for forming a pattern according to the present invention, the first region is formed with a second light-transmitting portion in hole shape so that the second light-transmitting portion is surrounded with a third light-shielding portion having a property of shielding the exposure light, and the second region is formed with the first light-transmitting portions, the first light-shielding portions and the second light-shielding portion.

With this method, the resist pattern with the slit features and the resist pattern with the hole features can be faithfully formed in the same step.

Preferably, a photomask according to the present invention comprises, on a translucent substrate, three or more first light-shielding portions each in insular shape having a property of shielding exposure light and spaced equidistantly, a second light-shielding portion having a property of shielding the exposure light and formed to connect the adjacent first light-shielding portions, and first light-transmitting portions each in slit shape having a property of transmitting the exposure light and formed to be surrounded with the first and second light-shielding portions. Preferably, the second light-shielding portion is formed to contain a point located equidistantly from the three or more first light-shielding portions.

In the photomask of the present invention, the second light-shielding portion is provided to connect the adjacent first light-shielding portions and to contain the point located equidistantly from the first light-shielding portions. This reduces the light intensity of the exposure light in the vicinity of the equidistantly-located point, and thus exposure can be performed using the photomask to form a resist pattern in which three or more insular features spaced equidistantly are faithfully reproduced. Specifically, for example, if a photomask provided with no second light-shielding portion is used, this increases the light intensity of the exposure light which is radiated in the vicinity of the region on the resist film corresponding to the point located equidistantly from the first light-shielding portions. Therefore, it is difficult to faithfully reproduce the insular features. In contrast to this, with the present invention, the second light-shielding portion is provided in the vicinity of the region on the photomask corresponding to the region of the resist film radiated with exposure light of a high intensity, that is, in the vicinity of the region thereof containing the point located equidistantly from the first light-shielding portions. Therefore, if this photomask is used, a resist pattern having insular features reproduced faithfully can be formed as described above. Note that this photomask would not be judged as having a mask pattern failure in a mask pattern check.

Preferably, in the photomask according to the present invention, the first light-shielding portion is of regular polygon.

With this photomask, the resist pattern having insular features in regular polygonal shape can be faithfully formed.

Preferably, in the photomask according to the present invention, the translucent substrate contains a first region having a first open area ratio and a second region having a second open area ratio higher than the first open area ratio.

In this case, even if the regions with different open area ratios are simultaneously exposed to light using the photomask with the different open area ratios, the resist pattern with the three or more insular features spaced equidistantly and the resist pattern with an open area ratio different from that of the resist pattern with the insular features can be faithfully formed in the same step.

Preferably, in the photomask according to the present invention, the first region is formed with a second light-transmitting portion in hole shape so that the second light-transmitting portion is surrounded with a third light-shielding portion having a property of shielding the exposure light, and the second region is formed with the first light-transmitting portions, the first light-shielding portions and the second light-shielding portion.

With this photomask, the resist pattern with the three or more insular features spaced equidistantly and the resist pattern with the hole features can be faithfully formed in the same step.

A second method for forming a pattern according to the present invention is characterized by comprising the steps of: radiating exposure light to a resist film through a photomask; and developing the resist film radiated with the exposure light to form a resist pattern having three or more insular features spaced equidistantly. The second method is further characterized in that the step of radiating exposure light is the step of radiating exposure light through the photomask including, on a translucent substrate, first light-shielding portions having a property of shielding the exposure light and having the same shapes as the three or more insular features in terms of plan arrangement, a second light-shielding portion having a property of shielding the exposure light and formed to connect the adjacent first light-shielding portions, and first light-transmitting portions each in slit shape having a property of transmitting the exposure light and formed to be surrounded with the first and second light-shielding portions, and that the second light-shielding portion is formed to contain a point located equidistantly from the three or more first light-shielding portions.

In the second method for forming a pattern according to the present invention, exposure is performed using the photomask in which the second light-shielding portion is provided to connect the adjacent first light-shielding portions and to contain the point located equidistantly from the first light-shielding portions. This reduces the light intensity of the exposure light in the vicinity of the equidistantly-located point, and thus a resist pattern can be formed in which three or more insular features spaced equidistantly are faithfully reproduced. Specifically, for example, if a photomask provided with no second light-shielding portion is used, this increases the light intensity of the exposure light which is radiated in the vicinity of the region on the resist film corresponding to the point located equidistantly from the first light-shielding portions. Therefore, it is difficult to faithfully reproduce the insular features. In contrast to this, with the present invention, the photomask is used in which the second light-shielding portion is provided in the region on the photomask corresponding to the region of the resist film radiated with exposure light of a high intensity, that is, in the region thereof containing the point located equidistantly from the first light-shielding portions. Therefore, a resist pattern having insular features reproduced faithfully can be formed as described above.

Preferably, in the second method for forming a pattern according to the present invention, the first light-shielding portion is of regular polygon.

With this method, the resist pattern having insular features in regular polygonal shape can be faithfully formed.

Preferably, in the second method for forming a pattern according to the present invention, the translucent substrate includes a first region having a first open area ratio and a second region having a second open area ratio higher than the first open area ratio, and the step of radiating exposure light includes the step of simultaneously radiating the exposure light to the first region and the second region.

With this method, even if the regions of the photomask with different open area ratios are simultaneously exposed to light, the resist pattern with the three or more insular features spaced equidistantly and the resist pattern with an open area ratio different from that of the resist pattern with the insular features can be faithfully formed in the same step.

Preferably, in the second method for forming a pattern according to the present invention, the first region is formed with a second light-transmitting portion in hole shape so that the second light-transmitting portion is surrounded with a third light-shielding portion having a property of shielding the exposure light, and the second region is formed with the first light-transmitting portions, the first light-shielding portions and the second light-shielding portion.

With this method, the resist pattern with the three or more insular features spaced equidistantly and the resist pattern with the hole features can be faithfully formed in the same step.

BRIEF DESCRIPTION OF THE DRAWINGS

FIG. 7A shows a line feature thereof according to the conventional example, and FIG. 7B shows a slit feature thereof according to the conventional example.

FIG. 8A shows a line feature thereof according to the conventional example, and FIG. 8B shows a slit feature thereof according to the conventional example.

FIG. 9A shows a line feature thereof according to the conventional example, which has the assist features additionally attached thereto, and FIG. 9B shows a slit feature thereof according to the conventional example, which has the assist features additionally attached thereto.

FIG. 10A shows via features in the photomask according to the conventional example, and FIG. 10B shows slit features therein according to the conventional example.

DETAILED DESCRIPTION OF THE PREFERRED EMBODIMENTS

A pattern formation method according to an embodiment of the present invention will be described with reference to the accompanying drawings.

Figure 1:
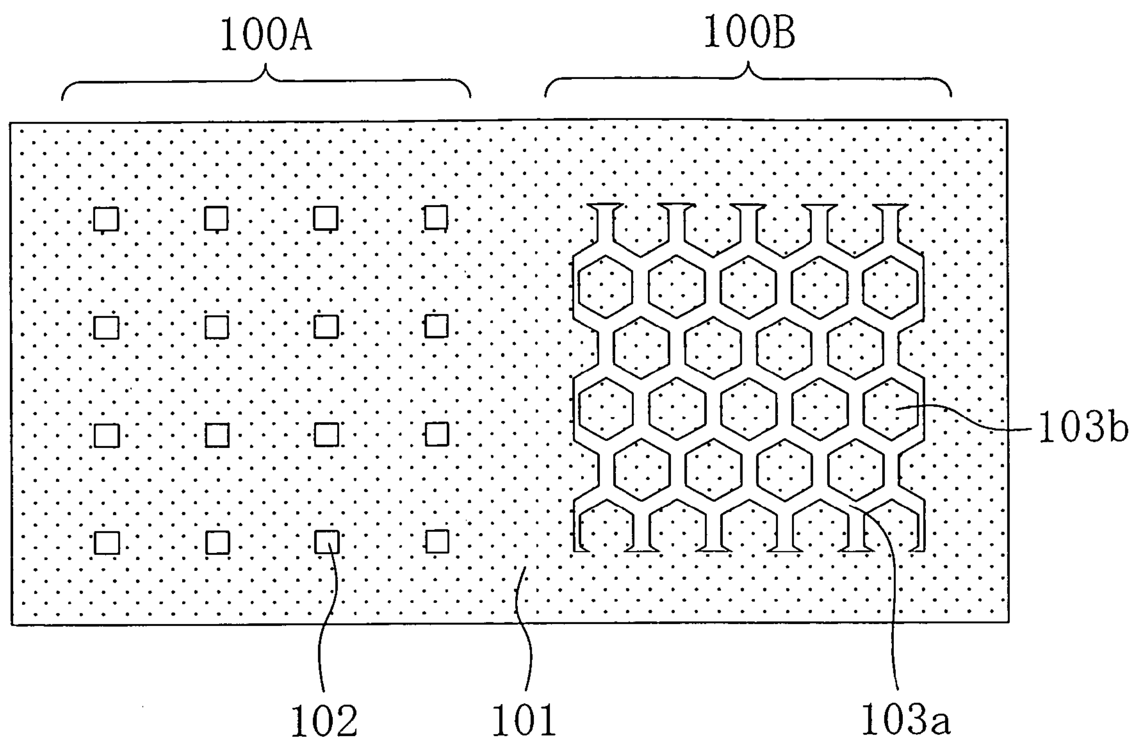
FIG. 1 is a plan view showing the configuration of a resist pattern according to an embodiment of the present invention.

FIG. 1 is a plan view showing the configuration of a resist pattern according to the embodiment of the present invention.

Referring to FIG. 1, the resist pattern according to the embodiment of the present invention is provided with a via pattern formation region 100A and a honeycomb via pattern formation region 100B with a honeycomb structure. To be more specific, the via pattern formation region 100A in a resist film 101 formed on a semiconductor substrate (not shown) is formed with a via pattern configured by forming hole-shaped first openings 102 in the resist film 101, while the honeycomb via pattern formation region 100B in the resist film 101 is formed with a honeycomb via pattern configured by forming slit-shaped second openings 103*a* in the resist film 101. Note that a plurality of hexagonal insular features 103*b* are present in the honeycomb via pattern.

For the via pattern formation region 100A to be formed with the via pattern, a photomask used has an open area ratio of about 0 to 5%. If the sides of respective holes constituting the via pattern have lengths smaller than 0.30 μm, light of a high intensity is required during exposure.

On the other hands, for the honeycomb via pattern formation region 100B to be formed with the honeycomb via pattern, a photomask used has a very high open area ratio of about 30 to 70%. Therefore, light of a high intensity is not required during exposure.

If the honeycomb via pattern is formed simultaneously in forming the via pattern that requires light of a high intensity, however, overexposure occurs in the honeycomb via pattern formation region 100B. This hinders formation of a honeycomb via pattern with a desired configuration. Such hindrance will be described below with reference to FIG. 2.

Figure 2:
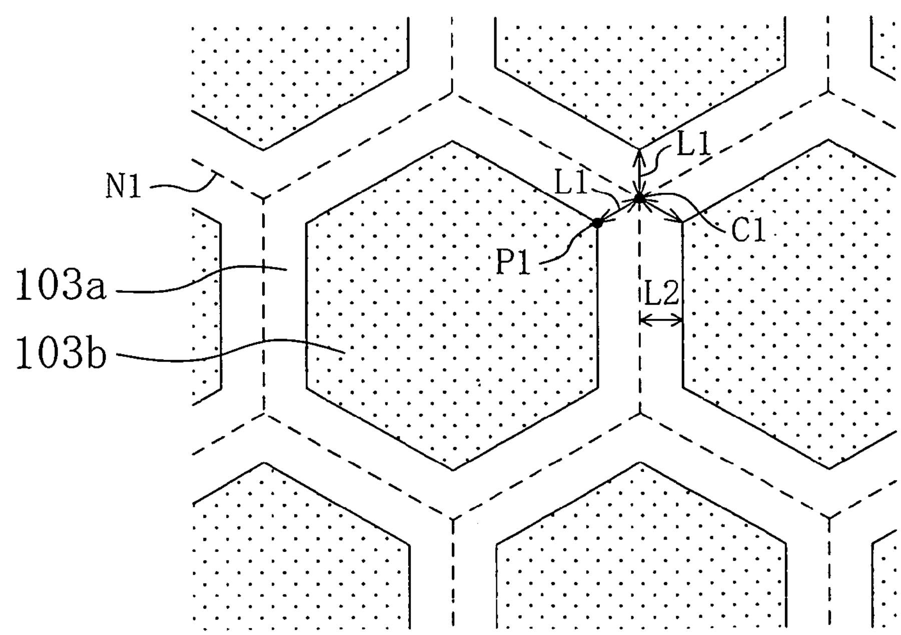
FIG. 2 is an enlarged plan view showing part of a subpattern with a honeycomb structure in the resist pattern according to the embodiment of the present invention.

FIG. 2 is an enlarged plan view showing part of the resist pattern in the honeycomb via pattern formation region 100B shown in FIG. 1. For convenience of description, FIG. 2 also illustrates center lines N1 between adjacent hexagonal insular features 103*b*, the distance L1 between the intersection C1 of the center lines N1 and an apex P1 of the hexagonal insular feature 103*b*, and the distance L2 between the center line N1 and the hexagonal insular feature 103*b*.

Figure 3:
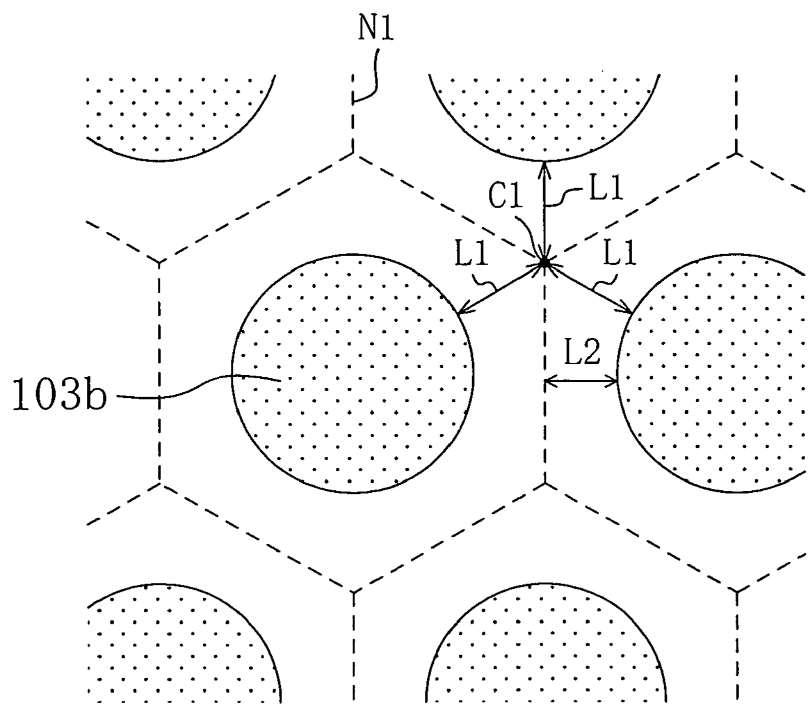
FIG. 3 is a plan view showing the configuration of a resist pattern according to the embodiment of the present invention, which is formed using a photomask with the same configuration as the resist pattern shown in FIG. 2 in terms of plan arrangement.

As is apparent from FIG. 2, the vicinity of a portion of the honeycomb via pattern containing the intersection C1 has a higher open area ratio than the vicinity of a portion thereof containing the distance L2. Moreover, exposure lights from three directions are condensed on the intersection C1 of the center lines N1, so that the light intensity becomes very high at this intersection. Thus, when a resist pattern is formed using a mask pattern on which a pattern having the same configuration as the honeycomb via pattern shown in FIG. 2 in terms of plan arrangement is transferred, a resist pattern is formed which has a plane configuration shown in FIG. 3. Specifically, as shown in FIG. 3, the apex P1 of the insular feature 103*b* shown in FIG. 2 becomes rounded, and the difference between the distance L1 from the intersection C1 of the center lines N1 to the insular feature 103*b* and the distance L2 from the center line N1 to the insular feature 103*b* becomes wider. This would induce troubles in fabrication steps after the lithography.

Figure 4:
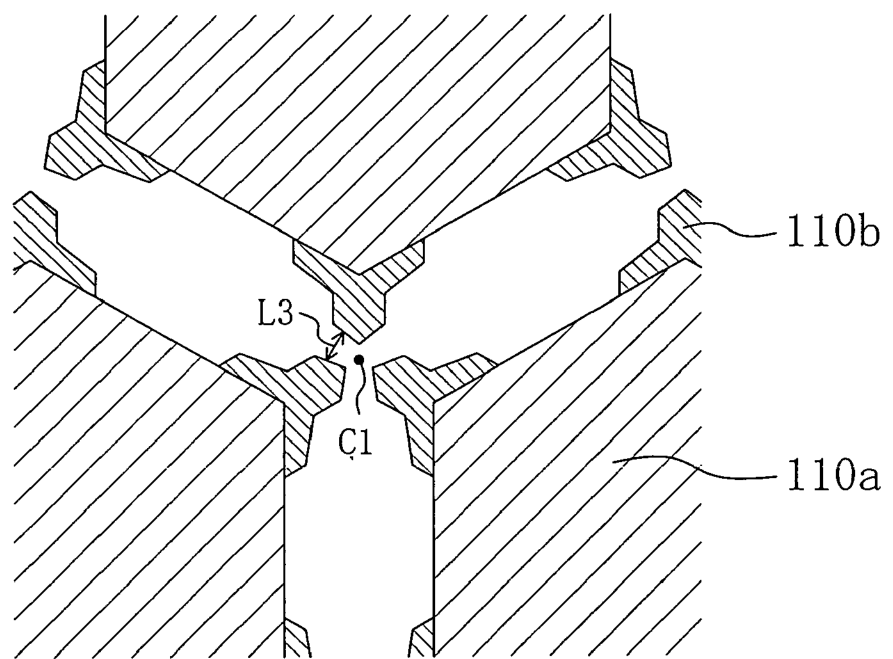
FIG. 4 is a plan view showing a mask pattern according to the embodiment of the present invention, which has assist features additionally attached to the configuration of the resist pattern shown in FIG. 2 in terms of plan arrangement.

To avoid the above troubles, an approach has been experimented of forming the resist pattern in FIG. 2 using a mask pattern with a plane configuration shown in FIG. 4.

The mask pattern shown in FIG. 4 is provided with first light-shielding portions 110*a* formed on a translucent substrate such as a glass substrate and used for forming a hexagonal insular feature 103*b* (see FIG. 2). Second light-shielding portions 110*b* serving as assist features for easing the light intensity in the vicinity of the intersection C1 of the center lines are additionally attached to the apices of each of the hexagonal first light-shielding portion 110*a*. When a resist pattern is formed using the mask pattern having this configuration, the light intensity in the vicinity of the intersection C1 is eased. This prevents formation of rounded apices of the hexagonal insular feature 103*b* as shown in FIG. 3.

As described above, the second light-shielding portion 110*b* is provided to diffuse the light concentration in the vicinity of the intersection C1.

However, since the second light-shielding portions 110*b* are added to the mask pattern shown in FIG. 4, the distance L3 between the second light-shielding portions 110*b* is significantly smaller than the distance defined by the design rule thereof. Therefore, in a mask pattern check for a photomask for forming a resist pattern, the mask pattern shown in FIG. 4 will be judged as having a mask pattern failure.

Figure 5:
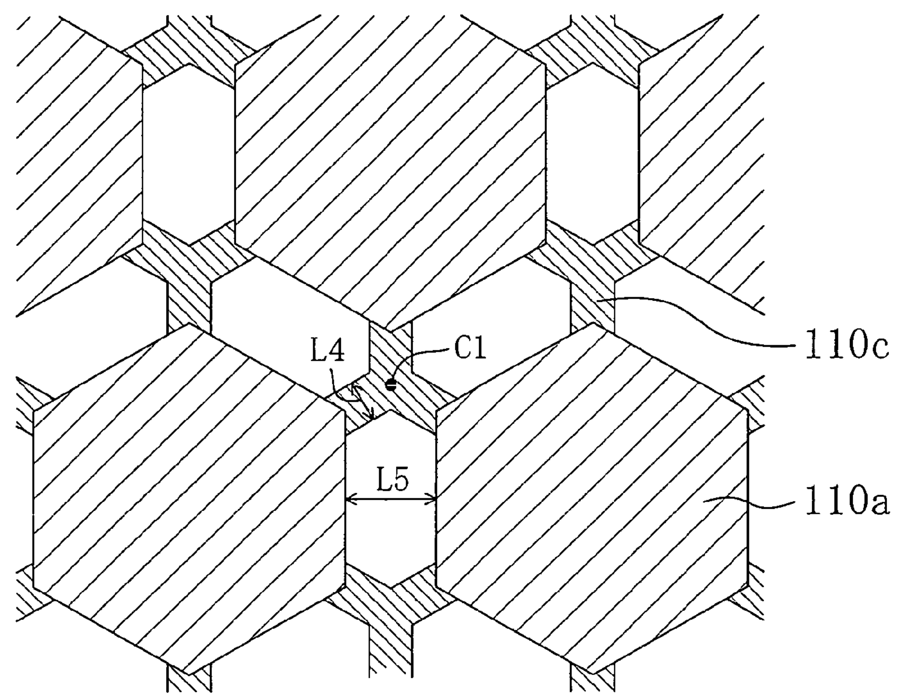
FIG. 5 is a plan view showing a mask pattern for forming the resist pattern shown in FIG. 2 according to the embodiment of the present invention.

From the various studies for solving this problem, the following fact has been found. In the resist pattern formation method according to the embodiment of the present invention, exposure lights from three directions are condensed in the vicinity of the intersection C1 of the center lines N1. In view of this, as shown in FIG. 5, the region where the intersection C1 is present is shielded from light and further a photomask is used which has a mask pattern with the light-shielding portions connecting the insular features to one another. This eases the light intensity in the vicinity of the intersection C1. Consequently, the resist pattern shown in FIG. 2 can be formed.

FIG. 5 is a plan view showing the configuration of the mask pattern used to form the honeycomb via pattern 103 shown in FIG. 2.

The mask pattern shown in FIG. 5 is provided with the first light-shielding portions 110*a* in hexagonal shape used to form the hexagonal insular features 103*b* (see FIG. 2) and further with third light-shielding portions 110*c* in insular shape. Each of the third light-shielding portions 110*c* contains the intersection C1 of the center lines N1, and is formed to extend in three directions toward which the first light-shielding portions 110*a* each in hexagonal shape are present and to connect the first light-shielding portions 110*a* to one another.

The third light-shielding portions 110*c* each have a width L4 that is not judged as a mask pattern failure in a mask pattern check. Moreover, in the case of the honeycomb via pattern as shown in FIG. 5 having slits facing each other at an angle of 120°, the width L5 of each of the slits is 1.5 to 2.5 times as great as the width L4 of each of the third light-shielding portions 110*c*. This eases the light intensity in the vicinity of the intersection C1 in FIG. 2. Therefore, formation of rounded apices of the hexagons in the resist pattern as shown in FIG. 3 can be prevented, and concurrently a mask pattern can be formed which is not judged as having a mask pattern failure in checking a mask pattern for forming a resist pattern.

Figure 6:
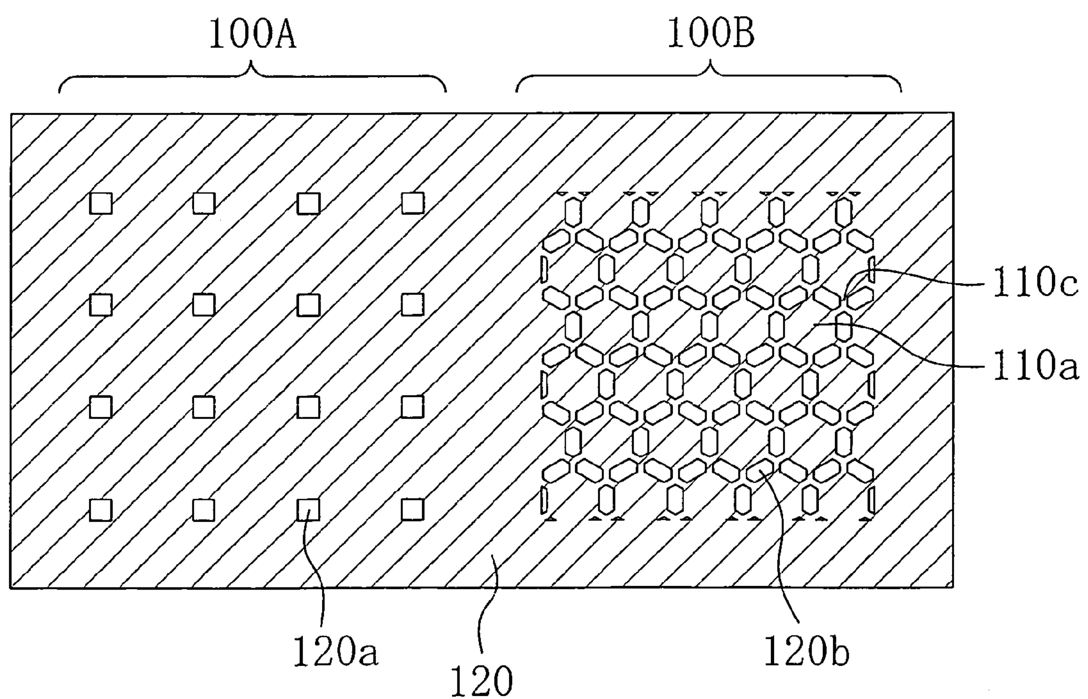
FIG. 6 is a plan view showing a mask pattern of a photomask for forming the resist pattern shown in FIG. 1.
Figure 7A:
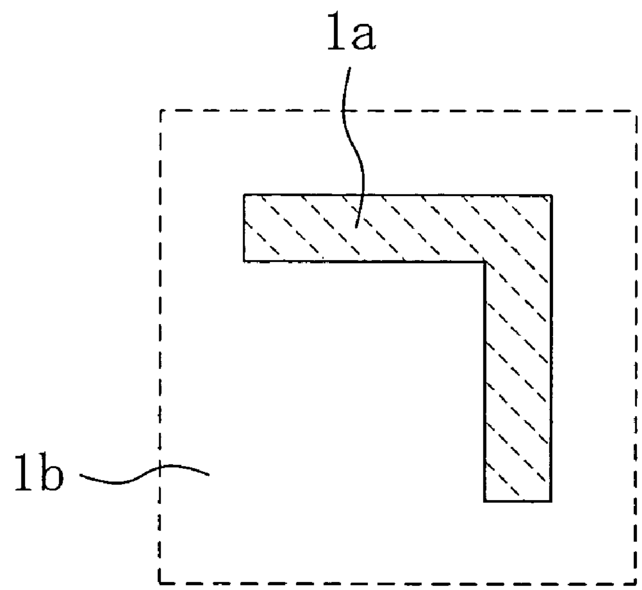
FIGS. 7A and 7B are plan views showing design patterns according to a conventional example.
Figure 7B:
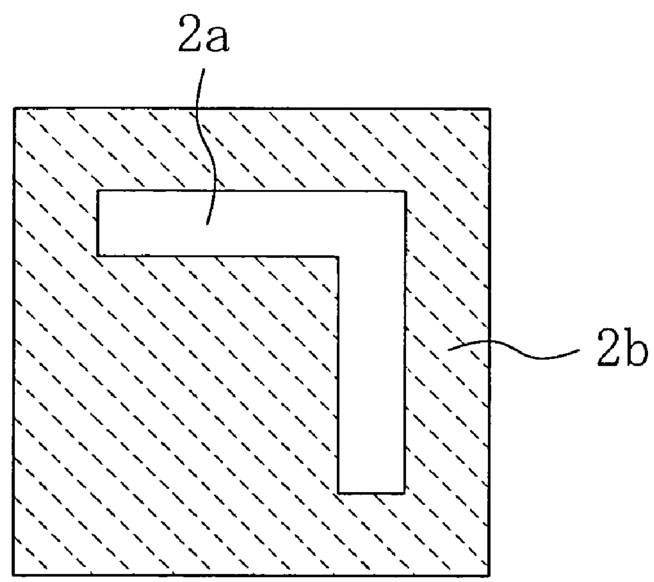
Figure 8A:
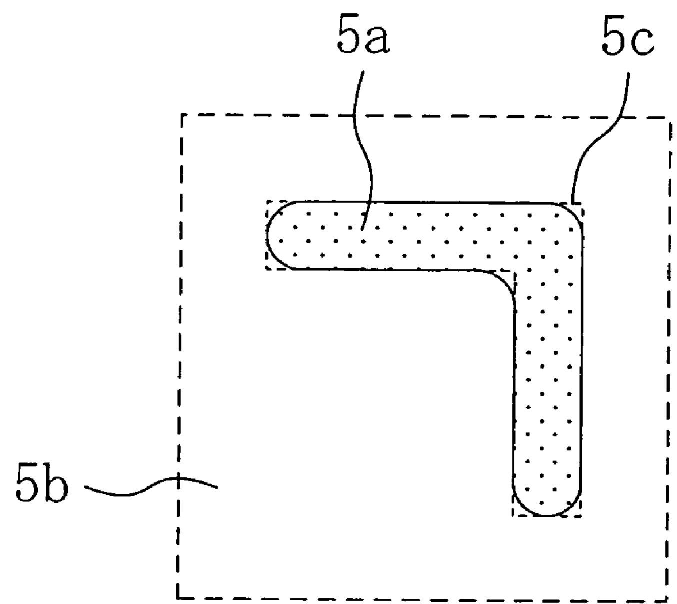
FIGS. 8A and 8B are plan views showing resist patterns according to the conventional example.
Figure 8B:
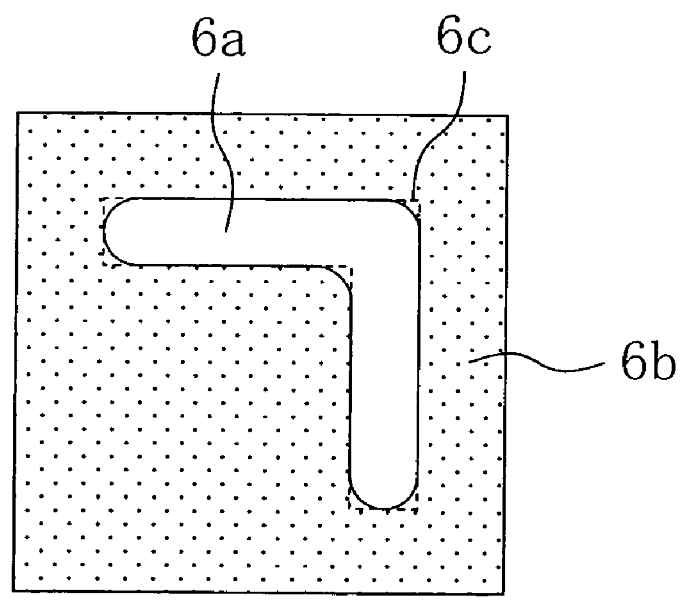
Figure 9A:
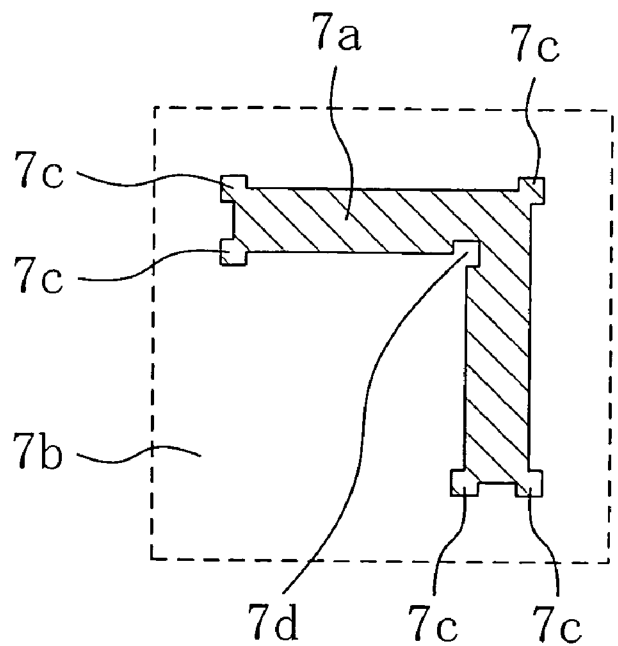
FIGS. 9A and 9B are plan views showing reticle patterns using assist features according to the conventional example.
Figure 9B:
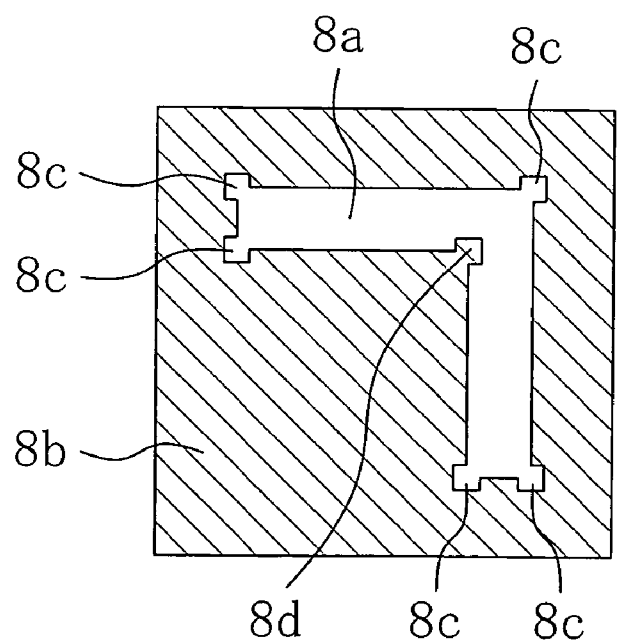
Figure 10A:
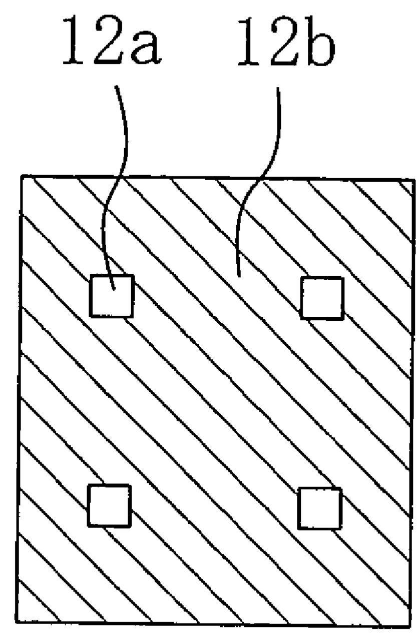
FIGS. 10A and 10B are plan views showing photomasks according to the conventional example.
Figure 10B:
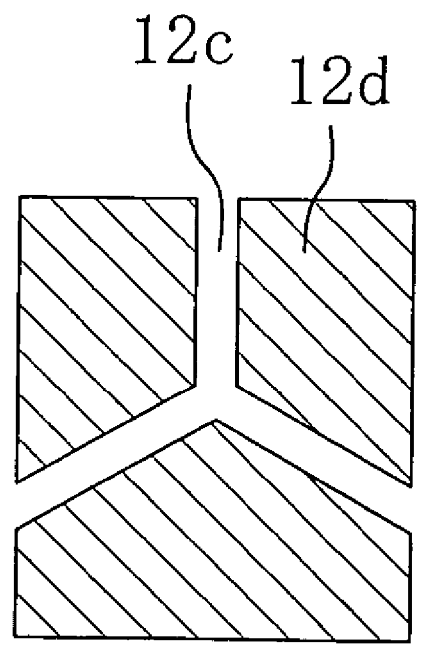
Figure 11A:
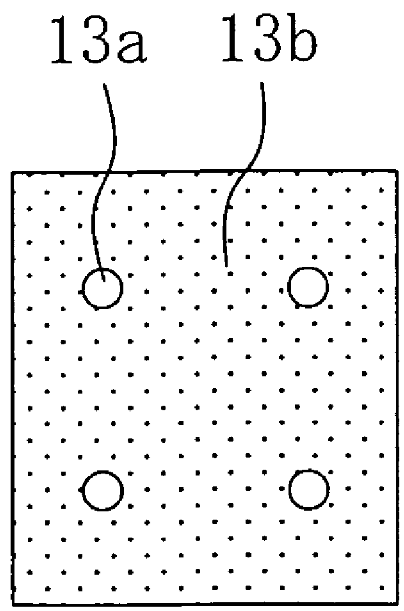
FIGS. 11A and 11B are plan views showing resist patterns according to the conventional example, which are formed using the photomasks shown in FIGS. 10A and 10B, respectively.
Figure 11B:
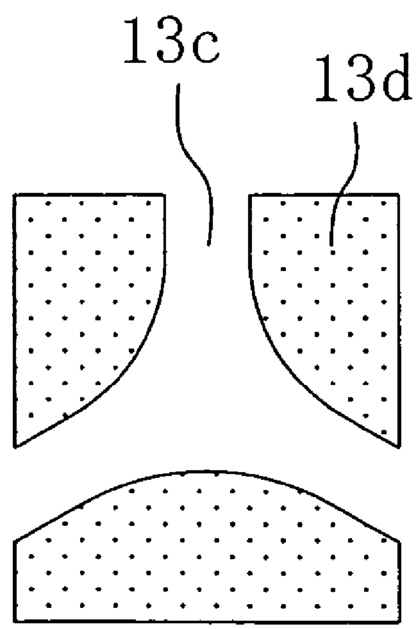

FIG. 6 is a plan view showing a pattern configuration of a photomask used to form the resist pattern shown in FIG. 1.

The photomask shown in FIG. 6 has the via pattern formation region 100A and the honeycomb via pattern formation region 100B. In the via pattern formation region 100A, the light-shielding portion 120 is formed with second light-transmitting portions 120*a* constituting a via pattern. The honeycomb via pattern formation region 100B is formed with slit features constituting first light-transmitting portions 120*b* in addition to the first light-shielding portions 110*a* and the third light-shielding portions 110*c* also shown in FIG. 5. The photomask shown in FIG. 6 can be used to form the resist pattern shown in FIG. 1.

The foregoing description has been made of the case where, as an exemplary pattern formation method according to one embodiment of the present invention, formation of the pattern having the honeycomb structure is carried out concurrently with formation of the via pattern. However, the present invention is not limited to the formation of the pattern having the honeycomb structure, and is effective also in the case where insular features arranged in grid pattern are formed.

As described above, the present invention is of usefulness in, for example, a method for simultaneously forming, in a via pattern formation step, via features and slit features having a width of a predetermined size or smaller and having intersections.

What is claimed is:

1. A photomask for forming a resist pattern, comprising, on a first region in a translucent substrate, three or more first light-shielding portions each in polygonal shape having a property of shielding exposure light and spaced equidistantly, a second light-shielding portion having a property of shielding the exposure light, having stripe shapes each linearly extending from each apex of polygons which comprise the three or more first light-shielding portions being adjacent to each other to a point which is located equidistantly from each of the three or more first light-shielding portions being adjacent to each other, and connecting the three or more first light-shielding portions being adjacent to each other so that each of the stripes contains the point, and first light-transmitting portions each in slit shape having a property of transmitting the exposure light and formed to be surrounded with the first and second light-shielding portions, on a second region in the translucent substrate, a second light-transmitting portion in hole shape for forming a hole-shaped feature, and a third light-shielding portion having a property of shielding the exposure light and surrounding the second light-transmitting portion, wherein, when the exposure light is radiated through the photomask, and the resist film is radiated with the exposure light, resist patterns having three or more polygonal features spaced equidistantly corresponding to the first light-shielding portions and a resist pattern having the hole-shaped feature corresponding to the second light-transmitting portion are formed, and the polygonal features and the small hole-shaped feature correspond to pattern of a semiconductor integrated circuit.

2. The photomask of claim 1, wherein the first light-shielding portion is of regular polygon.

3. The photomask of claim 1, wherein the first region has a first open area ratio and the second region has a second open area ratio smaller than the first open area ratio.

4. A method for forming a pattern by using a photomask, wherein the photomask includes, on a first region in a translucent substrate, three or more first light-shielding portions each in polygonal shape having a property of shielding the exposure light and spaced equidistantly from each other, a second light-shielding portion having a property of shielding the exposure light, having stripe shapes each linearly extending from each apex of polygons which comprise the three or more first light-shielding portions being adjacent to each other to a point which is located equidistantly from each of the three or more first light-shielding portions being adjacent to each other, and connecting the three or more first light-shielding portions being adjacent to each other so that each of the stripes contains the point, and first light-transmitting portions each in slit shape having a property of transmitting the exposure light and formed to be surrounded with the first and second light-shielding portions, on a second region in the translucent substrate, a second light-transmitting portion in hole shape for forming a hole-shaped feature, a third light-shielding portion having a property of shielding the exposure light and surrounding the second light-transmitting portion, and the method for forming a pattern includes:

radiating exposure light through the photomask on a resist film, and developing the resist film radiated with the exposure light to form resist patterns having three or more polygonal features spaced equidistantly corresponding to the first light-shielding portions and a resist pattern having a small hole-shaped feature corresponding to the second light-transmitting portion, and the polygonal features and the small hole-shaped feature correspond to pattern of a semiconductor integrated circuit.

5. The method of claim 4, wherein the first light-shielding portion is of regular polygon.

6. The method of claim 4, wherein the first region has a first open area ratio and the second region has a second open area ratio smaller than the first open area ratio, and the step of radiating exposure light includes the step of simultaneously radiating the exposure light to the first region and the second region.

7. The photomask of claim 1, wherein the first light-shielding portions are respectively in hexagonal shape and located equidistantly from each other in a honeycomb structure, and the second light-shielding portion having stripe shapes each linearly extending from each apex of the hexagons which comprise the three first light-shielding portions being adjacent to each other to a point which is located equidistantly from each of the three first light-shielding portions being adjacent to each other and connecting the three or more first light-shielding portions being adjacent to each other so as to contain a point which is located equidistantly from each of the three first light-shielding portions being adjacent to each other.

8. The method of claim 4, wherein the first light-shielding portions are respectively in hexagonal shape and located equidistantly from each other in a honeycomb structure, and the second light-shielding portion having stripe shapes each linearly extending from each apex of the hexagons which comprise three of the first light-shielding portions being adjacent to each other to a point which is located equidistantly from each of the three first light-shielding portions being adjacent to each other and connecting the three first light-shielding portions being adjacent to each other so that each of the stripes contains the point.

9. The photomask of claim 1, wherein a width of each of the slits of the first light-shielding portions is 1.5 to 2.5 times larger than the width of each of the stripes.

10. The method of claim 4, wherein a width of each of the slits of the first light-shielding portions is 1.5 to 2.5 times larger than the width of each of the stripes.

11. The method of claim 4, wherein a width of each of the slits of the first light-shielding portions is 1.5 to 2.5 times larger than the width of each of the stripes, and the step of radiating exposure light includes the step of simultaneously radiating the exposure light to the first region and the second region, at a light intensity necessary to form the hole-shaped features in the resist pattern.

* * * * *